United States Patent [19]

Hamaoki

[11] 4,166,927
[45] Sep. 4, 1979

[54] APPARATUS AND METHOD FOR FREQUENCY CHANNEL SELECTION IN A RADIOTELEPHONE SYSTEM

[75] Inventor: Roy T. Hamaoki, Richmond, Canada

[73] Assignee: British Columbia Telephone Company, Burnaby, Canada

[21] Appl. No.: 926,985

[22] Filed: Jul. 21, 1978

[51] Int. Cl.² .............................................. H04M 7/04
[52] U.S. Cl. .................................... 179/2 EB; 325/52
[58] Field of Search ........... 179/2 EB, 2 EA; 325/52, 325/468, 469, 470

[56] References Cited

U.S. PATENT DOCUMENTS

| | | | |
|---|---|---|---|
| 3,555,424 | 1/1971 | Malm | 179/2 EB |
| 3,913,017 | 10/1975 | Imaseki | 325/52 |
| 4,112,257 | 9/1978 | Frost | 179/2 EB |

*Primary Examiner*—Douglas W. Olms
*Attorney, Agent, or Firm*—Douglas M. Gilbert

[57] ABSTRACT

In a mobile radiotelephone system, N separate modulated carrier signals in N frequency channels are applied to a demodulating radio receiver which provides a succession of N different output signals each having idle and busy states. An idle and signal-to-noise detector monitors each of the output signals of the radio receiver. The detector provides a first logic signal when one of the output signals concurrently exhibits an idle state and has at least a predetermined minimum signal-to-noise level, and provides a second logic signal at all other times. A receiver switching circuit, in response to the second logic signal, causes the receiver to cyclically switch to each of the N frequency channels. When the receiver switches to a carrier signal which causes the detector to produce a first logic signal, the switching circuit causes the receiver to lock onto that particular carrier signal. Improved operation results from a gain control circuit which reduces the gain sensitivity of the receiver upon a change in state of the detector output signal from a first logic signal to a second logic signal. The gain sensitivity is then slowly increased as the receiver cyclically switches to each of the N frequency channels. When an idle receiver output signal is detected having at least the minimum level of signal-to-noise, the receiver switching circuit locks the receiver onto the particular carrier signal. This technique assures that the first such detected signal will provide the best frequency channel for the demodulating radio receiver.

2 Claims, 1 Drawing Figure

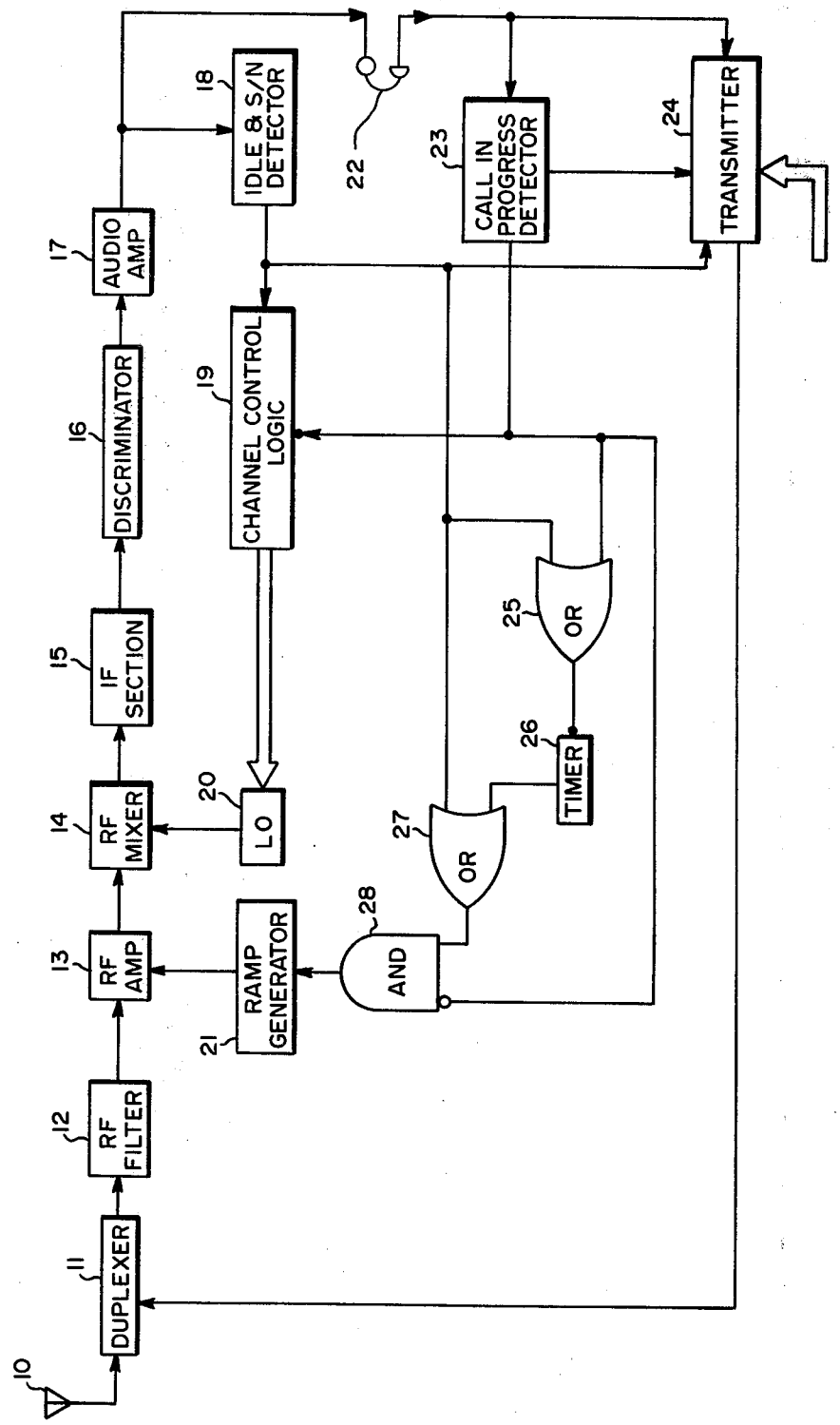

APPARATUS AND METHOD FOR FREQUENCY CHANNEL SELECTION IN A RADIOTELEPHONE SYSTEM

BACKGROUND OF INVENTION

This invention relates generally to telecommunications and more particularly to radio receivers used in mobile radiotelephone systems.

UHF and VHF mobile radiotelephone systems are used extensively throughout North America. Conventional two-way communications in these systems takes place between a mobile radiotelephone subscriber station and a central base station. Unlike the mobile station, the base station has the capability of simultaneous reception and transmission on all assigned frequency channels. The base station may also have several high power transmitters separated geographically. The use of geographically separated transmitters generally serves two purposes: it expands the system service area over a single transmitter location and it reduces the signal interference caused by signal blocking landmarks. It has been found, however, that such multiple transmitters can also cause problems for the mobile receivers.

Conventional mobile receivers automatically select the first idle frequency channel found in scanning the assigned frequency channels. If all frequency channels are located at a single base station transmitter, any frequency channel is as good or as poor as any other, so this selection procedure is more than adequate. But because signal strengths vary within a service area when multiple base transmitters are used, conventional mobile receivers will not necessarily select the best available frequency channel. And in the worst case, a conventional receiver can pick a frequency channel that is so marginal that the subscriber is left without service. This situation occurs when the mobile receiver selects a frequency channel that has sufficient idle tone present on the carrier signal for the receiver to recognize the channel as available. But due to non-reciprocity of carrier signals, the mobile transmitter is not able to access the terminal, and functionally the subscriber finds he is unable to communicate with the base.

It is an object of this invention to prevent a service interruption for a mobile subscriber due to a mobile receiver which selects marginal frequency channels.

It is a general object of this invention to provide apparatus to enable a mobile receiver to select the best available frequency channel wherever the subscriber happens to be located within the service area.

SUMMARY OF INVENTION

In a mobile radiotelephone system, apparatus is disclosed for selecting the particular idle frequency channel having the best signal-to-noise ratio. N different modulated carrier signals in each of N radio frequency channels are applied to a demodulating receiver which operates under the control of a switching circuit. The receiver produces at its output a succession of N different output signals, having idle and busy mutually exclusive states corresponding to the idle and busy states of the corresponding radio frequency channel. An idle and signal-to-noise detector, having a first input terminal, connects to the output of the receiver. This detector provides a first logic signal at a first output terminal when one of the receiver output signals concurrently exhibits an idle state and has at least a predetermined minimum signal-to-noise level. The detector provides a second logic signal at all other times.

The receiver output also connects to the input of a subscriber handset. At a second output terminal, the handset exhibits on-hook and off-hook mutually exclusive states which are sensed by a call-in-progress state detector. This state detector has an input which connects to the second output terminal, and also has a third output terminal providing an on-hook and off-hook output signal indicative of the on-hook and off-hook states respectively of the subscriber handset.

The receiver switching circuit referred to above, has an output and second and third input terminals, with the output adapted for connection to the receiver. The second input terminal connects to the first output terminal, and the third input terminal connects to the third output terminal. This switching circuit cyclically switches the receiver means to each of the N frequency channels in response to the second logic signal and further causes the receiver to remain at one of the N channels in response either to a first logic signal or to an off-hook signal.

And, a gain control circuit having an output and fourth and fifth input terminals is adapted for connection to the receiver. The fourth input terminal connects to the first output terminal, and the fifth input terminal connects to the third output terminal. The gain control circuit produces a control output signal which causes a decrease in the gain sensitivity of the receiver from a predetermined maximum gain to a predetermined minimum gain and thereafter causes an increase in gain sensitivity to the predetermined maximum. The gain increase occurs at a rate substantially slower than the rate of gain decrease so that the period of time required for the switching circuit to switch the receiver to each of the N frequency channels at least once is substantially greater than the time required for the gain sensitivity to increase from the minimum to the maximum. The control signal is produced in response to either a change in state of the detector output from a first logic signal to a second logic signal or in response to a predetermined timed interval after a change in the output state of the detector from a first logic signal to a second logic signal unless an off-hook output signal is produced by the call-in-progress detector. And, the gain control circuit is inhibited from generating the control output signal whenever an off-hook indication from the call-in-progress state detector is produced.

BRIEF DESCRIPTION OF THE DRAWING

The single FIGURE is a block diagram of a mobile radiotelephone demodulating receiver which illustrates the principles of the present invention.

DETAILED DESCRIPTION OF THE PREFERRED EMBODIMENT

In order to avoid cluttering the description of this embodiment with unnecessary detail, much of the mobile subscriber station equipment is not illustrated in the FIGURE, e.g. the signaling equipment and power circuitry.

Referring to the single FIGURE, there is shown a mobile subscriber station which includes a UHF antenna 10, a mobile RF (radio frequency) transmitter 24, and a heterodyne type radio receiver, 11–23, 25–28. UHF antenna 10 is operatively arranged to receive and transmit RF modulated carrier signals. Duplexer 11 is a filter device that permits the use of a single RF antenna for both the transmit and receive functions of the subscriber station. Connected to duplexer 11 is RF transmitter 24 and RF filter 12. RF filter 12 is a frequency bandpass device which eliminates out-of-band noise by passing only the desired frequency spectrum. After being filtered, the received signal is amplified by a variable gain RF amplifier 13. An RF mixer 14, in conjunction with a local oscillator 20, selects the desired frequency channel by heterodyning the amplified RF signal to one of N IF (intermediate frequency) signals. IF section 15 normally consists of one or more bandpass filters which reject noise outside the IF band of interest. It could also include a narrow-band IF amplifier. And, in an FM (frequency modulated) carrier system, a limiter might advantageously be used to reduce amplitude-modulation distortion. This filtered IF signal is then passed to discriminator 16. The desired information is extracted by frequency discriminator 16 which converts frequency variations in the IF signal to amplitude variations. The modulation, being in an audio-frequency band, is then amplified by audio amplifier 17 and applied to subscriber handset 22.

In the particular radiotelephone system illustrated in the FIGURE, idle and busy channel marking is accomplished with in-band signaling tones of 1200 Hz and 300 Hz respectively. Being in-band signals, an idle and S/N (signal-to-noise) detector 18 can be coupled to the output of audio amplifier 17 to sense the presence or absence of these in-band signaling tones. Detector 18 also detects the noise in a frequency slot (e.g. 3 kHz to 4 kHz) so as to provide some measure of the quality of the particular frequency channel being received. The binary 1/0 output of detector 18 is applied to a number of circuits including channel control logic circuit 19. Logic circuit 19 controls the local oscillator frequency, via a data bus connection, and thereby indirectly determines the particular channel to be received. Logic circuit 19 also controls, via a data bus connection only partially shown, the frequency of transmitter 24.

A call-in-progress detector 23 detects the on-hook/off-hook states of the subscriber handset 22 and detects when the base station is calling the particular mobile station. (The signaling equipment necessary to interpret the signaling pulses is not shown in the drawing.) One of two outputs of detector 23 is connected to transmitter 24 to cause the transmitter to turn on when subscriber handset 22 is off-hook. An off-hook condition is treated as a request for service causing transmitter 24 to initiate the proper outpulsing. The second outut of detector 23 is applied to a number of circuits including channel control logic circuit 19. The signal from this second output acts to inhibit logic circuit 19 from switching the receive channel frequency when handset 22 is in an off-hook condition.

The detailed operation of the mobile station equipment thus far described is well known by those skilled in the art. Such equipment is commercially available from a number of manufacturers of radiotelephone systems, e.g. Rydax, Inc., P.O. Box 2368, San Rafael, Calif., supplies both the base station (terminal equipment) and the subscriber station (mobile transceiver). The remaining circuitry in the FIGURE which affects the channel selection operation of the mobile station will now be described.

As shown in the FIGURE, the output of ramp generator 21 connects to RF amplifier 13. In a normal steady state operation, the output voltage of ramp generator 21 remains constant, e.g. 9 V (volts). When activated, ramp generator 21 affects the DC supply voltage of amplifier 13 causing it to drop almost immediately to a predetermined minimum, e.g. from 9 V to 1 V. Then the supply voltage is allowed to slowly rise from the minimum to the maximum voltage, e.g. 1 V to 9 V. By varying the voltage in such manner, a wide change in receiver gain sensitivity can be obtained (approximately 30 dB).

Generally the idle frequency channel having the greatest signal strength (i.e. highest S/N ratio) is also the best frequency channel in a given area. The present invention takes advantage of this relationship by providing a circuitry which recognizes this "best" signal and then bases its frequency selection on this information. When activated by the proper digital input, generator 21 causes amplifier 13 to reduce the receiver gain sensitivity as explained above. As the gain slowly rises, the channel control logic circuit 19 switches the demodulator circuitry (20, 14, and 15) through each of the assigned channel frequencies. The control logic switching rate is sufficiently rapid (two complete scans/second) and the gain increase sufficiently gradual (over 10 seconds from minimum to maximum) so that the first idle frequency channel detected necessarily will be the "best" frequency channel available.

Logic gates 25, 27, and 28 and timer 26 control when ramp generator 21 is activated. Both OR gates 25 and 27 will produce a binary 1 output when either or both inputs is a binary 1. Such a binary 1 from OR 25 will inhibit timer 26 from producing a momentary binary 1 at its output and will cause the timer circuit to be reset to a zero state. The functional operation of OR gate 25 and timer 26 will be explained later. AND gate 28 will have a binary 1 output when the input from OR gate 27 is a binary 1 and the other input is a binary 0. Ramp generator 21 will trigger on the leading edge of a binary 1 so that only a momentary 1 will cause the ramp voltage to be generated.

The conditions which will trigger generator 21 and the sequence of events that follow will now be described. If a call is not in progress, detector 23 will place a binary 0 on the inhibit input to AND gate 28, one input of OR gate 25, and the inhibit input to control logic circuit 19. If the frequency channel to which the receiver is locked onto goes busy or becomes unacceptably noisy, detector 18 changes from a binary 0 to a binary 1 output. The "alarm" indication passes through OR gate 27 and AND gate 28 to trigger ramp generator 21 which in turn reduces the receiver gain sensitivity. Also control logic 19 is activated, by the detector's change of state, causing the assigned channels to be sequentially scanned for the idle signaling tone and noise content. When the acceptable frequency channel is found, detector 18 changes back to a binary 0 output thereby causing the channel control logic circuit to hold LO 20 on that particular frequency channel. The gain sensitivity is subsequently allowed to increase to the maximum level. In the event that the gain increases to the maximum before a frequency channel is found, the gain sensitivity is not recycled since all frequency channels having acceptable noise must be in use. The first frequency channel to become available will atomatically be the "best" frequency channel since it will be the only frequency channel not in use.

The call-in-progress detector 23 inhibits the channel control logic 19 and through AND gate 28 ramp generator 21. The purpose of these two inhibiting signals is to prevent the receiver gain from changing while a call is in progress and to prevent the receiver from switching frequency channels while a call is in progress. Otherwise when a call was established with the local subscriber, the receive frequency channel being in use would be marked busy. Detector 18, sensing the loss of idle, would initiate a new search for an idle frequency channel and drop the gain to the minimum level. Such a sequence is clearly disruptive of expected operation and is, therefore, prevented by the call-in-progress detector 23.

Timer 26 adds another very useful feature to the frequency channel selection scheme. By periodically rescanning the frequency channels, the selection process periodically checks the selection previously made. When the mobile subscriber travels within the service area, the "best" frequency channel may also change even though all other conditions remain the same. However, unless the selection is periodically checked, the receiver has no way of determining that the particular frequency channel is no longer the "best" frequency channel. Once detector 18 senses an idle frequency channel with acceptable S/N, the channel control logic locks the LO onto that particular frequency channel until there is a loss of idle tone or the frequency channel becomes noisy. Before the frequency channel becomes unusable due to a change in location, it is necessary to recheck the previous selection. A new search should be initiated within a predetermined time period (e.g. 100 seconds) after the previous selection has been made.

The ramp generator 21 is periodically triggered through gates 28 and 27 by the output pulse of timer 26. This forces the gain sensitivity to drop which results in the S/N of all frequency channels to be unacceptable. Detector 18 then commands the channel control logic to switch LO 20 through the various frequency channels. As the gain sensitivity slowly increases, the "best" frequency channel for the new location will be the first one detected by detector 18.

It is desirable not to trigger a change in gain initiated by timer 26 when an acceptable idle frequency channel cannot be found or when a call is in progress. The output of OR gate 25 inhibits timer 26 if either of these events occurs.

Thus while the present invention has been described with reference to a specific embodiment, numerous modifications will suggest themselves to those of ordinary skill in the art. For example, there are any number of ways the gain sensitivity of a receiver could be changed to accomplish the same result as described above. Instead of using RF amplifier 13 in the manner described, a variable RF attenuator could be used equally well. The invention described herein is also not limited to a particular modulation scheme. Any form of modulation could be used (e.g. AM) equally well. It is also not limited to a particular band of frequencies.

What is claimed is:

1. In a mobile radiotelephone system having N separated radio frequency channels, apparatus for selecting the particular idle frequency channel having the best signal-to-noise ratio, said apparatus comprising:

demodulating receiver means for receiving N different modulated carrier signals in each of said N radio frequency channels, said demodulator means under the control of switching means providing at an output a succession of N different output signals, and each output signal having idle and busy mutually exclusive states corresponding to the idle and busy state of the corresponding radio frequency channel;

first detector means having a first input terminal connected to the output of said receiver means and having a first output terminal, said detector means providing a first logic signal when one of said receiver output signal concurrently exhibits an idle state and has at least a predetermined minimum signal-to-noise level, and said detector means providing a second logic signal at all other times;

subscriber handset means having an input connected to said receiver means output and having a second output terminal, said handset means having on-hook and off-hook mutually exclusive states;

a call-in-progress state detector for detecting the on-hook and off-hook states of said handset means, said state detector having an input connected to said second output terminal and also having a third output terminal providing an on-hook and off-hook output signal indicative of the on-hook and off-hook states respectively of said handset means;

receiver switching means having an output and second and third input terminals, said output adapted for connection to said receiver means, said second input terminal connected to said first output terminal, and said third input terminal connected to said third output terminal, said switching means for cyclically switching said receiver means to each of said N frequency channels in response either to said first logic signal or to said off-hook signal; and gain control means having an output and fourth and fifth input terminals, said output adapted for connection to said receiver means, said fourth input terminal connected to said first output terminal, and said fifth input terminal connected to said third output terminal, said gain control means producing a control output signal for causing a decrease in the gain sensitivity of said receiver means from a predetermined maximum gain to a predetermined minimum gain and thereafter for causing an increase in said gain sensitivity to said predetermined maximum, said gain increase occurring at a rate substantially slower than the rate of gain decrease so that the period of time required for said switching means to switch said receiver means to each of said N frequency channels at least once is substantially greater than the time required for the gain sensitivity to increase from said minimum to said maximum, said control output signal being produced in response to either (a) a change in state of said first detector means output signal from said first logic signal to said second logic signal or (b) in response to a predetermined timed interval after a change in output state of said first detector means from said first logic signal to said second logic signal unless an off-hook output signal is produced by said call-in-progress detector, and said gain control means being inhibited from generating said control output signal whenever an off-hook indication from said call-in-progress detector means is produced.

2. Apparatus as in claim 1 wherein said gain control means comprises:

a ramp generator having an input and producing said control output signal when the proper signal is applied to its input;

an AND gate having an output coupled to the input of said ramp generator and also having a non-inverting input and an inverting input, said inverting input coupled to said third output terminal;

a first OR gate having an output coupled to the non-inverting input of said AND gate and first and second inputs, said second input coupled to said first output terminal;

timer means having an output coupled to the first input of said first OR gate and also having an inhibit input connection, said timer means periodically producing a third logic signal after a predetermined timed interval; and a second OR gate having first and second input and an output, said output coupled to the inhibit input connection of said timer means, said first input coupled to said third output terminal, and said second input coupled to said first output terminal, said OR gate causing said timer means to be inhibited from producing said third logic signal
(a) so long as said first detector means provides a second logic signal or
(b) so long as said call-in-progress state detector provides an off-hook output signal.

* * * * *